United States Patent [19]

Brcich et al.

[11] Patent Number: 4,542,454
[45] Date of Patent: Sep. 17, 1985

[54] APPARATUS FOR CONTROLLING ACCESS TO A MEMORY

[75] Inventors: Joseph A. Brcich, San Jose; Roy J. Levy, Sunnyvale; Jimmy Madewell, San Jose; N. Bruce Threewitt, Los Gatos, all of Calif.

[73] Assignee: Advanced Micro Devices, Inc., Sunnyvale, Calif.

[21] Appl. No.: 480,996

[22] Filed: Mar. 30, 1983

[51] Int. Cl.⁴ .............................................. G11C 7/00
[52] U.S. Cl. ................................. 364/200; 371/13; 371/38; 365/222
[58] Field of Search .......................... 371/13, 18, 38; 365/200, 222; 364/200, 900

[56] References Cited

U.S. PATENT DOCUMENTS

| | | | |
|---|---|---|---|
| 4,183,096 | 1/1980 | Cenker et al. | 371/13 X |
| 4,319,356 | 3/1982 | Kocol et al. | 371/38 |
| 4,369,510 | 1/1983 | Johnson et al. | 364/900 X |
| 4,380,812 | 4/1983 | Ziegler, II et al. | 371/38 |
| 4,412,314 | 10/1983 | Proebsting | 371/13 X |

OTHER PUBLICATIONS

"Am2960 Series", Advanced Micro Devices, 1980.
"8207 Advanced Dynamic RAM Controller", Intel Corporation, Apr. 1982.
"LSI Memory Controllers: System Design Trends and Architectures", Northcon 1982 Professional Program Papers, #14, May 18-20, 1982.
"Dynamic Storage Cleanup", IBM Technical Disclosure Bulletin, vol. 25, No. 4, Sep. 1982.

Primary Examiner—James D. Thomas
Assistant Examiner—David L. Clark
Attorney, Agent, or Firm—Patrick T. King; J. Vincent Tortolano; Mark A. Haynes

[57] ABSTRACT

A computer system having a central processing unit, a dynamic memory controller, an error detection and correction network and a dynamic memory for storing data that are subject to being refreshed and to data bit errors. The dynamic memory controller has a refresh mode for controlling access to the memory only to refresh the data, a refresh with error detection and correction mode, for controlling access to the memory to merge or simultaneous refresh a row of data while detecting and correcting data bit errors, and a read-/write mode for controlling access to the memory in response to CPU requests for a read/write memory operation.

5 Claims, 3 Drawing Figures

APPARATUS FOR CONTROLLING ACCESS TO A MEMORY

DESCRIPTION

1. Technical Field

The present invention relates generally to apparatus for controlling access to a memory and, more particularly, to a controller for controlling access to a dynamic memory storing data that are subject to being refreshed and to data bit errors.

2. Background Art

Memories are used in computer systems to store data in the form of, for example, computer data words having a number of bits. A dynamic memory is one type or class of memory that is widely used because of its many advantages, such as low cost per bit. A dynamic random access memory subsystem typically has a plurality of rows and columns for storing the data, and may comprise a plurality of banks, each with a plurality of rows and columns.

One disadvantage of the dynamic memory, and for well-known reasons, is that the stored data, whether correct or incorrect, must be periodically refreshed. Another disadvantage, and also for well-known reasons, is that the stored data are subject to bit errors which cause correctly stored data to become incorrect. The bit errors can be "soft" or "hard" errors, as also is well-known. For example, a given bit of a data word, after being correctly written into a bit location, may randomly and non-destructively to the memory change state due to a variety of factors such as sensitivity to alpha-particle ionization, thereby creating a soft bit error. Both of these dynamic memory problems are solved in the following manner.

In addition to the dynamic memory subsystem, the computer system will have, generally, a central processing unit (CPU), a dynamic memory controller (DMC) for controlling access to the memory, an error detection and correction (EDC) unit which receives data from the memory and transfers data to the CPU over a system data bus, and a timing controller for the DMC and the EDC unit. Also, generally, the computer system will have at least two modes of operation, one being a normal read/write mode in which the CPU requests access to the memory and the other being a refresh mode to refresh the data. The latter occurs during a background period when the CPU may not be requesting or is not granted such access to the memory.

For the refresh mode, the dynamic memory controller will internally generate sequential refresh addresses to rows of stored data in the memory. Typically, one entire row of data in each bank for a given refresh address is refreshed during a refresh cycle. The memory accessing for refresh purposes is known as an address function since the data stored in the addressed row are only refreshed and are not read.

For the read/write mode, the dynamic memory controller responds to a row, column and bank address received from the CPU by addressing the memory to, for example, read a stored data word at that location. The read data word is then fed to the error detection and correction unit, which either passes this data word through to the CPU over the system bus if it is correct, or first, if possible, corrects the data using a read-modify-write (RMW) cycle by which the incorrect data word is detected and corrected, if possible, then written into the memory and then transferred to the CPU. This type of memory access is known as an address and data function since the memory is addressed and the data word is acted upon. Thus, the refreshing of the data and the error detection and correction of the data are performed independently of one another, resulting in several disadvantages.

One disadvantage of this independent operation is that the data words that are stored in the memory and not periodically requested by the CPU can accumulate multiple-bit errors. For example, as is known, the error detection and correction unit may be able to detect multiple-bit errors, but may only be able to correct single-bit errors in a given data word. Another disadvantage is that the memory read/write cycle is relatively long due to the time required to perform the error detection and correction function, including the read-modify-write cycle, thereby significantly degrading system performance.

SUMMARY OF THE INVENTION

The invention is an apparatus for controlling access to a memory storing data which are subject to being refreshed and to data bit errors, comprising means for addressing the memory only to refresh the data and means for addressing the memory to simultaneously refresh the data and detect and correct the data bit errors.

In accordance with the present invention, either of two refresh control modes can be performed during a background period when access to the memory by a CPU for read/write purposes is not requested or granted. One is a refresh mode in which the memory is addressed only to refresh the data. The other is a mode in which the memory is accessed to simultaneously refresh the data and detect and correct data bit errors. As will be more specifically described, the latter mode has the advantages of cleansing each data word of single-bit errors, thereby preventing multiple-bit errors from accumulating, and increasing the speed of the memory read/write mode without significantly increasing the overhead time needed to perform this background function.

BEST MODE FOR CARRYING OUT THE INVENTION

Figure 1:
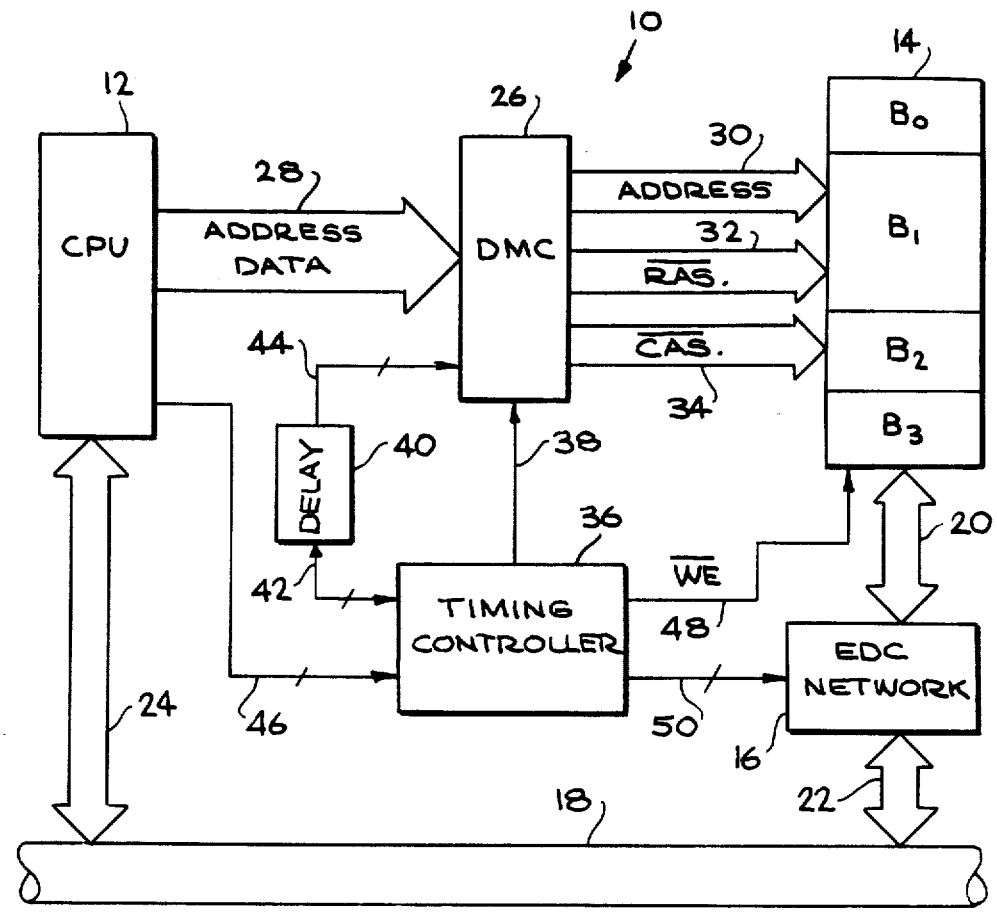
FIG. 1 is a block diagram of a computer system.

FIG. 1 shows an overall computer system 10 having a central processing unit (CPU) 12, a dynamic memory 14 for storing data words, an error detection and correction network 16 and a system data bus 18. The error detection and correction network 16 transfers data words between the dynamic memory 14 and system data bus 18 via an internal data bus 20 and an internal data bus 22, while another internal data bus 24 transfers data words between the system data bus 18 and the CPU 12. Thus, data words are transferred from the dynamic memory 14 to the CPU 12 over the internal data bus 20, the error detection and correction network 16, the internal data bus 22, the system data bus 18 and the internal data bus 24, with the reverse path occurring for a data word transfer from the CPU 12 to the memory 14. In a conventional manner, memory 14 can comprise a plurality of banks, for example, four banks $B_0$–$B_3$, with each bank $B_0$–$B_3$ having a plurality of rows and a plurality of columns.

A dynamic memory controller (DMC) 26 controls access to the memory 14 under four modes to be described more fully below, including (0) refresh without error detection and correction, (1) refresh with error detection and correction, (2) read/write and (3) clear. The dynamic memory controller 26 receives address data from the CPU 12 over an address bus 28 and produces memory access address data on an address bus 30, row address strobe ($\overline{RAS}$) lines 32 and column address strobe ($\overline{CAS}$) lines 34. As will be further described, depending on the mode of operation, the dynamic memory controller 26 will either respond to the address data received on address bus 28 or generate internally its own address data for accessing the memory 14 over bus 30, lines 32 and lines 34.

A timing controller 36 controls the dynamic memory controller 26 via a control line 38 and a timing control or delay 40 that is coupled between the dynamic memory controller 26 and the controller 36 via lines 42 and lines 44. The controller receives memory control data over control lines 46 from the CPU 12, produces a write enable ($\overline{WE}$) signal over a line 48 to control the reading or writing of the data words on memory 14 and also controls the error detection and correction network 16 over control lines 50.

Figure 2:
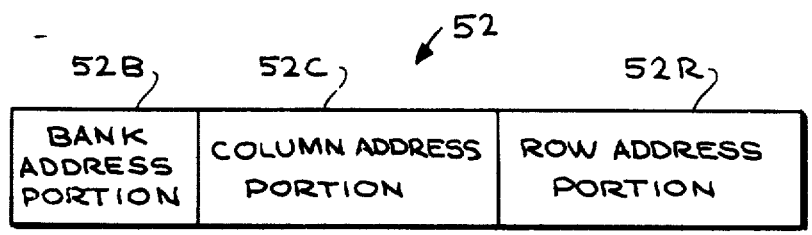
FIG. 2 is an illustration of an address used to access a memory.

FIG. 2 illustrates an address word 52 of a predetermined bit length that is used for describing the accessing of the memory 14, as will be discussed more specifically below. The address word 52, as shown, can be generated by the CPU 12 or internally by the dynamic memory controller 26. The address word 52 has a row address portion 52R, a column address portion 52C and a bank address portion 52B. The row address portion 52R comprises the least-significant bits (LSB), the column address portion 52C the next-more-significant bits and the bank address portion 52B the most-significant bits (MSB) of the address word 52. The number of bits in each address portion 52R, 52C, 52B will depend on the size and configuration of the memory 14. For example, assume that the memory 14 has the four banks $B_0$–$B_3$, with 128 rows and 512 columns per bank $B_0$–$B_3$. The row address portion 52R will have seven bits, the column address portion 52C will have nine bits and the bank address portion will have two bits. It will be easily appreciated that the bit length of each portion 52R, 52C, 52B can be different, again depending upon the size and configuration of the memory 14.

Figure 3:
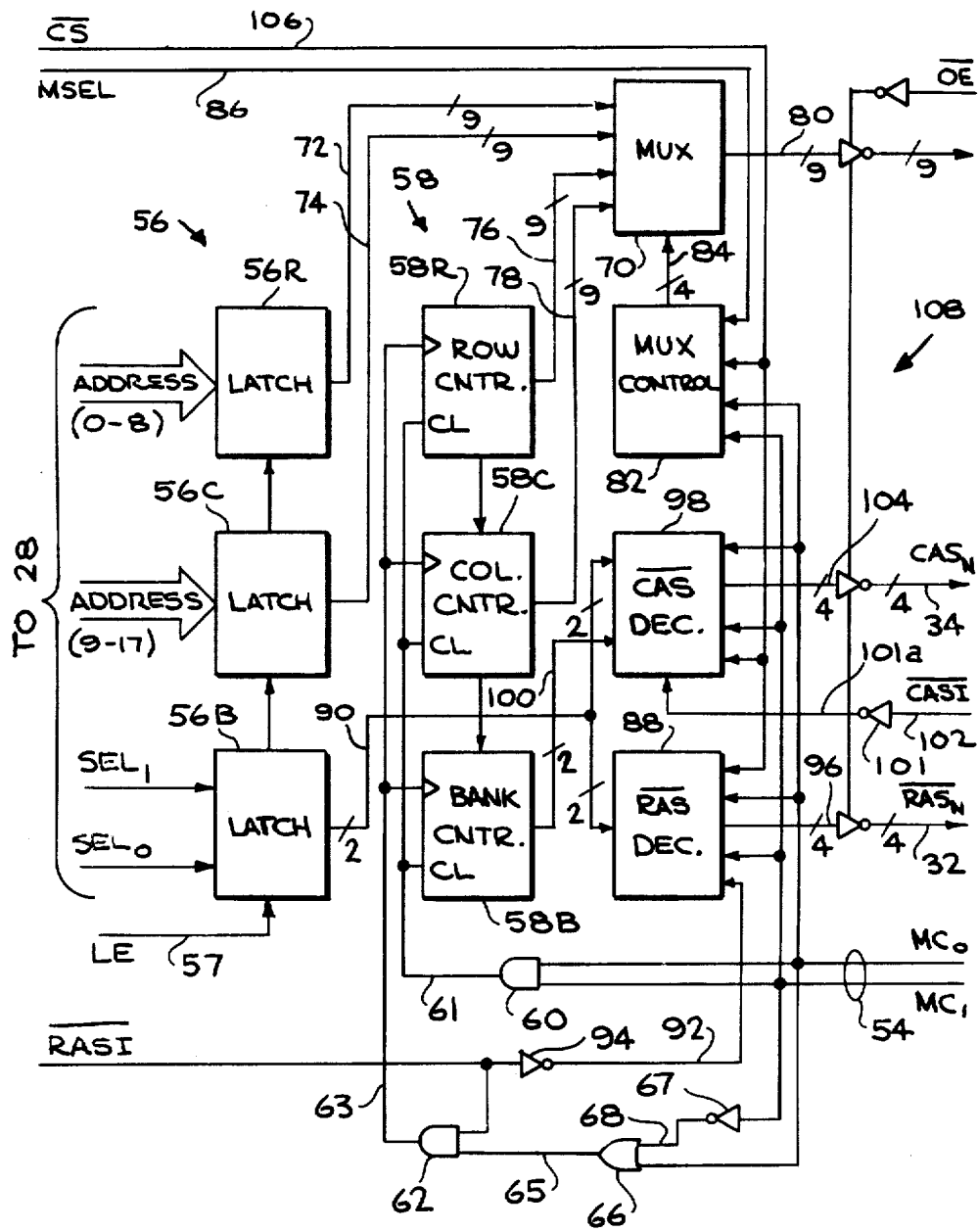
FIG. 3 is a block diagram of a dynamic memory controller of the present invention.

FIG. 3 shows the dynamic memory controller 26 which controls access to the memory 14 under the previously mentioned four modes of operation. The dynamic memory controller 26 receives a 2-bit mode control (MC) word having bits $MC_0$ and $MC_1$ over two lines 54. TABLE I lists the four different modes identified by $MC_0$ and $MC_1$, as follows:

TABLE I

| $MC_1$ | $MC_0$ | MODE (0–3) |
|---|---|---|
| 0 | 0 | Refresh without error detection and correction |
| 0 | 1 | Refresh with error detection and correction, or INITIALIZATION |
| 1 | 0 | Read/Write |
| 1 | 1 | Clear |

Specifically, Mode 0 is the refresh mode without error detection and correction in which access to the memory 14 occurs only for refreshing the data words. Mode 1 is a refresh mode with error detection and correction in which access to the memory 14 occurs for simultaneously refreshing the data words and detecting and correcting any bit errors or for initializing the memory on power-up. Mode 2 is a normal read/write mode in which access to the memory 14 is controlled for reading or writing data. Mode 3 is a clear mode and is used for purposes of clearing the dynamic memory controller 26, as will be further described.

A latch shown generally at 56 is used to store the address word 52 received from the CPU 12 over the address bus 28 for Mode 2. Latch 56 includes a row address latch 56R, a column address latch 56C and a bank address latch 56B. Latch 56R stores the row address portion 52R, e.g., bits 0–8, latch 56C stores the column address portion 52C, e.g., bits 9–17, and latch 56B stores the bank address portion 52B, i.e., two select bits SEL0 and SEL1 which identify one of the four banks $B_0$–$B_3$ of the memory 14 to be selected. A latch enable (LE) signal is received by the latch 56 on a line 57. LE is an active high input which causes the latch 56 to be transparent, thereby allowing each latch 56R, 56C, 56B to accept new input address data on bus 28. When LE is low, the input address data are latched by latches 56R, 56C, 56B.

An address counter shown generally at 58 is used to generate internally address data for Mode 0 and for Mode 1. Address counter 58 includes a row address counter 58R producing row address portion 52R, a column address counter 58C producing column address portion 52C and a bank address counter 58B producing bank address portion 52B. Address counter 58 is cleared by the output of an AND gate 60 over a line 61, with the inputs to gate 60 being bits $MC_1$ and $MC_2$ carried on the lines 54. When $MC_1$ and $MC_2$ are logic 11 (see TABLE I), gate 60 is enabled to clear address counter 58 via line 61.

Address counter 58 is clocked by the output of an AND gate 62 on a line 63. One input to gate 63 on a line 64 is a row address strobe input $\overline{RASI}$ and the other input on a line 65 is an enabling signal from the output of an OR gate 66. $MC_0$ is provided directly as one input to gate 66 while $MC_1$ is provided via an inverter 67 and a line 68 as the other input to gate 66. Thus, for Mode 0, Mode 1 and Mode 3, gate 66 will have a logic 1 at one or both of its inputs to produce a logic 1 enabling signal on line 65 to enable gate 62. Then, when $\overline{RASI}$ goes high, gate 62 outputs a logic 1 on line 63 to clock address counter 58.

A 4-port multiplexer 70 receives the row address portion 52R stored in latch 56R over lines 72, the column address portion 52C stored in latch 56C over lines 74, the row address portion 52R generated by row address counter 58R over lines 76 and the column address portion 52C generated by the column address counter 58C over lines 78. Multiplexer 70 switches any one of these four inputs to an output on lines 80 in response to a 4-bit word $S_0$–$S_3$ generated by a multiplexer control 82 on lines 84.

Multiplexer control 82 responds to $MC_0$, $MC_1$ carried on line 54, as well as a multiplexer select (MSEL) signal received on a line 86. When MSEL is high or logic 1, the lower order bits on lines 72 or on lines 76, i.e., the row address portion 52R, is switched to output lines 80 depending on the mode defined by $MC_0$, $MC_1$, and when MSEL is low, the higher order bits on lines 74 or lines 78, i.e., the column address portion 52C, is switched to lines 80 also depending on the mode defined b $MC_0$, $MC_1$.

A row address strobe ($\overline{RAS}$) decoder 88 has one input coupled to the output of latch 56B over lines 90. $\overline{RAS}$ decoder 88 also has an input coupled over a line 92 to the output of an inverter 94 whose input is $\overline{RASI}$. $\overline{RAS}$ decoder 88 also decodes $MC_0$, $MC_1$ which are received via lines 54 and provides its outputs on lines 96.

The decoded outputs on lines 96 can be any one or all of four row address strobe $\overline{RAS_0}$-$\overline{RAS_3}$ signals for activating banks $B_0$-$B_3$ respectively. While not shown, the row address portion 52R switched by multiplexer 70 onto lines 80 will be latched in the memory 14 in response to $\overline{RAS_0}$-$\overline{RAS_3}$. For Mode 0 (refresh without error detection and correction) and for Mode 1 (refresh with error detection and correction), $\overline{RAS}$ decoder 88 responds by outputting all four active $\overline{RAS_0}$-$\overline{RAS_3}$ in response to $\overline{RASI}$. For Mode 2 (read/write), one of $\overline{RAS_0}$-$\overline{RAS_3}$ will go active low, as identified by SEL0, SEL1 on lines 90, in response to $\overline{RASI}$.

A column address strobe ($\overline{CAS}$) decoder 98 receives the output of bank latch 56B over the lines 90, as well as the output of bank counter 58B over lines 100. $\overline{CAS}$ decoder 98 also responds, via an inverter 101 and input line 101a, to a column address strobe input $\overline{CASI}$ carried on a line 102, as well as $MC_0$, $MC_1$ on line 54.

The decoded output of $\overline{CAS}$ decoder 98 is produced on lines 104 and can be any one of four column address strobe ($\overline{CAS_0}$-$\overline{CAS_3}$) signals for activating banks $B_0$-$B_3$ respectively. While not shown, the column address portion 52C switched by multiplexer 70 onto lines 80 will be latched in the memory 14 in response to $\overline{CAS}_0$-$\overline{CAS}_3$. For Mode 0 (refresh without error detection and correction), all four $\overline{CAS_0}$-$\overline{CAS_3}$ remain inactive. For Mode 1 (refresh with error detection and correction), one of four $\overline{CAS_0}$-$\overline{CAS_3}$, as identified by the bank address portion 52B on lines 100, is produced on lines 104 in response to $\overline{CASI}$. For Mode 2 (read/write), one of four $\overline{CAS_0}$-$\overline{CAS_3}$, as identified by the bank address portion 52B on lines 90, is produced on lines 104 in response to $\overline{CASI}$.

A chip select ($\overline{CS}$) signal on a line 106 is used to enable multiplexer control 82, $\overline{RAS}$ decoder 88 and $\overline{CAS}$ decoder 98. When $\overline{CS}$ is low, the dynamic memory controller 26 operates in a normal manner to be described below in all four modes of operation. When $\overline{CS}$ goes high, the dynamic memory controller 26 still performs the Mode 0 and Mode 1, but does not perform Mode 2.

Also shown generally at 108 is an output driver circuit that is enabled by an output enable ($\overline{OE}$) signal to drive or to disable the output signals of multiplexer 70, $\overline{RAS}$ decoder 88 and $\overline{CAS}$ decoder 98. These respective outputs are produced on address bus 30, $\overline{RAS}$ lines 32 and $\overline{CAS}$ lines 34.

With reference again to FIG. 1, the timing controller 36 is similar to prior controllers used in computer systems which can perform, independently, a refresh mode and a read/write mode in which error detection and correction can occur. In addition, however, controller 36 will respond to control signals received from the CPU 12 over lines 46 for purposes of the present invention. Controller 36, at the appropriate time, will output $\overline{RASI}$ on line 42, which after a delay provided by delay 40, outputs $\overline{RASI}$ on line 44 to be received on line 64 of the dynamic memory controller 26. Delay 40 has timing taps (not shown) whose outputs in sequence and in response to $\overline{RASI}$ are MSEL and $\overline{CASI}$. Controller 36 also decodes control signals from the CPU 12 to output $MC_0$, $MC_1$ on line 38 and that are carried by lines 54 of the dynamic memory controller 26.

The four modes of operation of the dynamic memory controller 26 now will be described, followed by a description of the overall operation of computer system 10.

Mode 0—Refresh Without Error Detection and Correction

For this mode, in which $MC_0$, $MC_1$ are at logic 00, multiplexer control 82 controls multiplexer 70 in response to $MC_0$, $MC_1$, to couple lines 76 to lines 80. Therefore, as row counter 58R is clocked by the output of gate 62 on line 63 in response to the enabling signal on line 65 and $\overline{RASI}$ on line 64, each row address portion 52R from row counter 58R is switched from lines 76 to lines 80 and outputted to the memory 14 via address bus 30. $\overline{RAS}$ decoder 88 responds to $\overline{RASI}$ on line 64 via inverter 94 and to $MC_0$, $MC_1$ by outputting all four $\overline{RAS_0}$-$\overline{RAS_3}$, thereby activating the plurality of rows of all banks $B_0$-$B_3$. $\overline{CAS}$ decoder 98 responds to $MC_0$, $MC_1$ by outputting no active $\overline{CAS_0}$-$\overline{CAS_3}$ on lines 96, thereby deactivating the plurality of columns of all banks $B_0$-$B_3$.

Consequently, a given row in each bank $B_0$-$B_3$ of memory 14 is activated at the address specified by the particular row address portion 52R of the row counter 58R. Thus, four rows of data in memory 14, one in each bank $B_0$-$B_3$, can be refreshed simultaneously during a refresh cycle.

Thereafter, with each generation of $\overline{RASI}$ on lines 64, row counter 58R is clocked to produce a new row address portion 52R on lines 76 that is coupled by multiplexer 70 to lines 80. Therefore, another group of four rows, one in each bank $B_0$-$B_3$ of memory 14, is refreshed. This process of incrementing row counter 58R will continue with each generation of $\overline{RASI}$, whereby all the rows of memory 14 are refreshed.

Mode 1—Refresh With Error Detection and Correction (or Initialization)

For this mode, $MC_0$, $MC_1$ are at logic 01. Multiplexer control 82 responds to $MC_0$, $MC_1$ and to MSEL to cause multiplexer 70 to couple the row address portion 52R of row counter 58R on lines 76 or the column address portion 52C of column counter 58C on lines 78 onto lines 80. When MSEL is high, lines 76 are coupled to lines 80 and when MSEL is low, lines 78 are coupled to lines 80, as previously mentioned.

Also, during this mode $\overline{RAS}$ decoder 88 responds to $\overline{RASI}$ on line 64, via inverter 94 and line 92, and to $MC_0$, $MC_1$ to produce all four active signals $\overline{RAS_0}$-$\overline{RAS_3}$ for activating the plurality of rows in the four banks $B_0$-$B_3$. Furthermore, $\overline{CAS}$ decoder 98 responds to $\overline{CASI}$ on line 102 via inverter 101, to $MC_0$, $MC_1$ and to the bank address portion 52B from bank counter 58B to output on lines 104 one of the four signals $\overline{CAS_0}$-$\overline{CAS_3}$ for respectively activating one of the plurality of columns of one of the banks $B_0$-$B_3$.

In operation, assume that the address counter 58 has been cleared and that the first $\overline{RASI}$ on line 64 for the first refresh cycle has been generated, which clocks address counter 58. As a result, and with MSEL high, four rows, one in each bank $B_0$-$B_3$, are addressed by the row address portion 52R from row counter 58R and are refreshed in unison. Then during the generation of this first $\overline{RASI}$, when MSEL goes low, the column address portion 52C from column counter 58C is coupled to memory 14, whereby the data word in the addressed column in one bank $B_0$-$B_3$ activated by one $\overline{CAS}_0$-$\overline{CAS}_3$ in response to the bank address portion 52B and $\overline{CASI}$ is read.

The data word that is read is then coupled to the error detection and correction network 16 which then performs a conventional read-modify-write (RMW) cycle, during which a conventional error detection and correction algorithm is utilized to detect and correct bit errors. When the algorithm is completed, if an error was detected, the data word is written into the current addressed location of memory 14 for this first refresh cycle.

Then, after an appropriate refresh period delay, a second $\overline{RASI}$ is produced on line 64 for a second refresh cycle. Address counter 58 again is clocked by this $\overline{RASI}$. Since the row address portion 52R is the lowest order address portion, with the column address portion 52C and the bank address portion 52B the higher and highest address portions, respectively, the same column in the same bank $B_0$-$B_3$ is addressed and activated, but a new group of four rows, one in each of the four banks $B_0$-$B_3$, is addressed and activated. Consequently, for this second refresh cycle, when MSEL is high, the new group of four rows is refreshed. Thereafter, when MSEL goes low, a new data word is read and fed to the error detection and correction network 16, whereby another read-modify-write cycle is performed, as previously described.

This process of clocking address counter 58 with $\overline{RASI}$ in preparation for each refresh cycle, and then performing the refresh with error detection and correction during each refresh cycle continues as described above. Note that after row counter 58R is clocked to capacity, on the next refresh cycle the column counter 58C will be incremented to address a new column in the one bank $B_0$-$B_3$ and the row counter 58R will restart at its first row address portion 52R. Thereafter, when the column counter 58C is clocked to capacity, on the next $\overline{RASI}$ the bank counter 58B is incremented, whereby another bank $B_0$-$B_3$ will be activated. The row and column addressing then continues as described above to refresh with error detection and correction the entire memory 14.

Furthermore, this particular Mode 1 is also used for initialization purposes when power is first supplied to the computer system 10. With this mode, by which the entire memory 14 is accessed, a known data pattern can be written to initialize the memory 14.

Mode 2—Read/Write

For this mode in which $MC_0$, $MC_1$ are logic 10, the input address 52 received from the CPU 12 is latched in latch 56. Multiplexer control 82 responds to $MC_0$, $MC_1$ and to MSEL by first causing multiplexer 70 to select the row address portion 52R on lines 72 and then to select the column address portion 52C on lines 74. Both the $\overline{RAS}$ decoder 88 and the $\overline{CAS}$ decoder 98, in response to $\overline{RASI}$ and $\overline{CASI}$, respectively, decode the bank address portion 52B on lines 90 to output on lines 96 one $\overline{RAS}_0$-$\overline{RAS}_3$ and one $\overline{CAS}_0$-$\overline{CAS}_3$, respectively, whereby one bank $B_0$-$B_3$ is activated.

Consequently, data are read or written to the addressed location of memory 14 via error detection and correction network 16.

As the CPU 12 requests other accesses to the memory 14 during this mode, other addresses will be stored in latch 56. The same operation as described above is performed by the dynamic memory controller 26 to access the memory 14 at the memory location identified by the particular address 52 stored in latch 56.

Mode 3—Clear

This mode is used to clear the address counter 58 and to place the address counter 58 into the start of the refresh sequence described above, i.e., refresh only (Mode 0) or refresh with error detection and correction (Mode 1). In this mode, $MC_0$, $MC_1$ are logic 11, whereby AND gate 60 is enabled to clear address counter 58. In addition, $\overline{RAS}$ decoder 88 responds to $MC_0$, $MC_1$ by outputting all four $\overline{RAS}_0$-$\overline{RAS}_3$, whereas $\overline{CAS}$ decoder 88 outputs inactive $\overline{CAS}_0$-$\overline{CAS}_3$.

Overall System Operation

As an example of the operation of computer system 10, assume that the CPU 12 is on-line and is requesting access to the memory 14. Also assume that the dynamic memory controller 26 is not performing the background function of Mode 0 or Mode 1. Therefore, in response to control signals from the CPU 12, controller 36 will output the control signals previously described for Mode 2. The dynamic memory controller 26 will then perform the read/write memory accessing function.

Periodically, and in response to control signals from the CPU 12, controller 36 will generate the control signals to place the dynamic memory controller 26 in Mode 0 or Mode 1. Therefore, either refresh or refresh with error detection and correction can be performed. Alternatively, and similar to prior computer systems 10, controller 36 can initiate the control signals to place the dynamic memory controller 26 in Mode 0 or Mode 1 if the CPU 12 has not, within a predetermined time, requested these modes via the control signals on lines 46.

In summary, by providing a refresh with error detection and correction, i.e., Mode 1, the data words stored in memory 14 can be periodically cleansed of single-bit errors, thereby minimizing the likelihood of multiple-bit errors accumulating in a given data word. Thus, for example, should a single-bit error appear in a data word, it can be detected and corrected by the error detection and correction network 16 and then the corrected data word rewritten into the memory 14. The additional time required to perform the error detection and correction function during the cycle that a row of data is being refreshed, i.e., the merging or simultaneous operation of refresh with error detection and correction for each refresh cycle as described for Mode 1, does not significantly degrade system performance. For example, characteristically, dynamic memories such as memory 14 spend approximately 2% of their bandwidth for performing refresh only (Mode 0), which means that the memory 14 can be available to the CPU 12 for a read/write operation (Mode 2) with about a 98% bandwidth. By merging refresh with error detection and correction (Mode 1), and employing, for example, a 450-nsec. read-modify-write cycle for the error detection and correction portion of Mode 1, the bandwidth for performing refresh with error detection and correction increases only to about 2.9%, thereby reducing memory availability by the CPU 12 only to about 97%.

We claim:

While memory availability is reduced to 97%, the speed of the memory read/write Mode 2 is significantly increased. This is because fewer data words stored in memory 14 will have bit errors, thereby enabling the error detection and correction network 16 to directly and quickly pass through the data words onto bus 18.

Other aspects, objects and advantages of the present invention can be obtained from a study of the drawings and the appended claims.

1. A controller for accessing a dynamic memory having a plurality of banks, and a plurality of rows and a plurality of columns for each of the plurality of banks, the memory storing data which are subject to being refreshed and to data bit errors, said controller having a read/write mode, a refresh mode and a refresh with error detection and correction mode, comprising:

(a) a latch for storing first address data for addressing the memory for the read/write mode, the first address data having a first row address portion, a first column address portion and a first bank address portion;

(b) an address counter for generating second address data for addressing the memory for the refresh mode and the refresh with error detection and correction mode, the second address data having a second row address portion, the second column address portion and a second bank address portion;

(c) means for carrying a row address strobe input, a column address strobe input, a mode control input identifying any one said mode and a multiplexer select input;

(d) multiplexer means, responsive to said mode control input and said multiplexer select input, for outputting to the memory the first row address portion and the first column address portion for the read/write mode or the second row address portion and the second column address portion for the refresh mode or the refresh with error detection and correction mode;

(e) row address strobe decoder means, responsive to said first bank address portion, said mode control input and said row address strobe input, for producing and outputting to the memory any one of a plurality of row address strobe signals for the read/write mode and for producing and simultaneously outputting all of the plurality of row address strobe signals for the plurality of banks, respectively, for the refresh mode and for the refresh with error detection and correction mode;

(f) column address strobe decoder means, responsive to said first bank address portion, said second bank address portion, said mode control input and said column address strobe input, for producing and outputting to the memory any one of a plurality of activating column address strobe signals for the read/write mode and the refresh with error detection and correction mode and deactivating the column address strobe signals for the refresh mode; and (g) timing means for monitoring the activity of control signals for the dynamic memory and connected to said mode control input for generating mode control signals to said mode control input in response to the activity of the control signals to dynamically select any one said mode.

2. A controller, according to claim 1, wherein said address counter is clocked in response to said row address strobe input.

3. A controller, according to claim 2, wherein said address counter is cleared in response to said mode control input.

4. A controller, according to claim 3, wherein said address counter comprises:

(a) a row counter for producing the second row address portion;

(b) a column counter for producing the second column address portion; and (c) a bank counter for producing the second bank address portion.

5. A controller, according to claim 1, further comprising timing controller means for generating said row address strobe input, said column address strobe input and said mode control input.

* * * * *